United States Patent
Lei et al.

(10) Patent No.: US 11,828,905 B2
(45) Date of Patent: Nov. 28, 2023

(54) DUAL LINE DIODE ARRAY DEVICE AND MEASUREMENT METHOD AND MEASUREMENT DEVICE FOR PARTICLE VELOCITY

(71) Applicant: INSTITUTE OF ATMOSPHERIC PHYSICS, CHINESE ACADEMY OF SCIENCES, Beijing (CN)

(72) Inventors: Hengchi Lei, Beijing (CN); Jiatian Chen, Beijing (CN); Minsong Huang, Beijing (CN); Xiaoqing Zhang, Beijing (CN); Shouyin Zheng, Beijing (CN)

(73) Assignee: INSTITUTE OF ATMOSPHERIC PHYSICS, CHINESE ACADEMY OF SCIENCES, Beijing (CN)

( * ) Notice: Subject to any disclaimer, the term of this patent is extended or adjusted under 35 U.S.C. 154(b) by 668 days.

(21) Appl. No.: 16/960,900

(22) PCT Filed: Feb. 11, 2018

(86) PCT No.: PCT/CN2018/076211
§ 371 (c)(1),
(2) Date: Jul. 9, 2020

(87) PCT Pub. No.: WO2019/144443
PCT Pub. Date: Aug. 1, 2019

(65) Prior Publication Data
US 2020/0333508 A1 Oct. 22, 2020

(30) Foreign Application Priority Data

Jan. 26, 2018 (CN) .......................... 201810077744.1
Jan. 26, 2018 (CN) .......................... 201810078233.1
Jan. 26, 2018 (CN) .......................... 201810078235.0

(51) Int. Cl.
*G01W 1/14* (2006.01)
*H01L 31/0203* (2014.01)

(52) U.S. Cl.
CPC ........... *G01W 1/14* (2013.01); *H01L 31/0203* (2013.01)

(58) Field of Classification Search
CPC ...... G01P 5/00; G01P 5/18; G01P 5/20; G01P 5/22; G01P 3/486; G01P 3/64;
(Continued)

(56) References Cited

U.S. PATENT DOCUMENTS 6,020,594 A 2/2000 Tschudi
6,914,674 B1 7/2005 Wang
(Continued)

FOREIGN PATENT DOCUMENTS

CN 87212647 U 8/1988
CN 2037478 U 5/1989
(Continued)

OTHER PUBLICATIONS

Huang, Application and design for imaging and measurement system based on photodiode array, 2015, Chinese Journal of Quantum Electronics (Year: 2015).*
(Continued)

*Primary Examiner* — John Fitzgerald
*Assistant Examiner* — Truong D Phan
(74) *Attorney, Agent, or Firm* — Bayramoglu Law Offices LLC

(57) ABSTRACT

A dual line photodiode array device encapsulates, on a photoelectric sensing element, two columns of photodiode array units having the same specification and performance; the dual line photodiode array device includes a first photodiode array unit and a second photodiode array unit that are arranged parallel to each other and is used for achieving
(Continued)

the measurement of particle velocity. The particle velocity may be more accurately measured by means of integrating the two columns of photodiode array units on a single photosensitive element. The dual line photodiode array device may also be applied to the measurement of raindrops and sea spray droplets.

17 Claims, 3 Drawing Sheets

(58) Field of Classification Search
CPC ..... G01P 11/00; G01P 13/0086; G01N 15/02; G01N 15/0205; G01N 2015/0222; G01N 2015/0294; G01N 2015/03; G01N 2015/045; G01N 15/00; G01N 2015/0003; G01N 2015/1075; G01N 2203/0676; G01N 30/74; G01N 2291/011; H01L 27/14643
See application file for complete search history.

(56) References Cited

U.S. PATENT DOCUMENTS

| | | | | |
|---|---|---|---|---|
| 2003/0098422 | A1* | 5/2003 | Silcott | G01N 15/0205 250/458.1 |
| 2003/0210412 | A1* | 11/2003 | Ishibashi | B41J 2/2135 358/1.9 |
| 2003/0212742 | A1* | 11/2003 | Hochmuth | H04N 21/2365 709/204 |
| 2012/0155899 | A1* | 6/2012 | Watanabe | G03G 15/5058 399/49 |
| 2016/0188965 | A1* | 6/2016 | McClure | G06V 40/20 382/103 |

FOREIGN PATENT DOCUMENTS

| | | | |
|---|---|---|---|
| CN | 1309427 A | * | 8/2001 |
| CN | 101148119 A | | 3/2008 |
| CN | 101168874 A | | 4/2008 |
| CN | 101424869 A | | 5/2009 |
| CN | 101477379 A | | 7/2009 |
| CN | 101514993 A | | 8/2009 |
| CN | 201392306 Y | | 1/2010 |
| CN | 102436015 A | | 5/2012 |
| CN | 202814847 U | | 3/2013 |
| CN | 103033857 A | | 4/2013 |
| CN | 103149605 A | | 6/2013 |
| CN | 103592263 A | | 2/2014 |
| CN | 103957360 A | * | 7/2014 |
| CN | 104111485 A | | 10/2014 |
| CN | 104345018 A | | 2/2015 |
| CN | 104730280 A | | 6/2015 |
| CN | 105448945 A | | 3/2016 |
| CN | 105572688 A | | 5/2016 |
| CN | 106092835 A | | 11/2016 |
| CN | 106546513 A | | 3/2017 |
| EP | 2522988 A1 | * | 11/2012 |
| FR | 2275776 A1 | | 1/1976 |
| GB | 1178572 A | | 1/1970 |
| JP | 2004294101 A | | 10/2004 |
| JP | 2011002257 A | * | 1/2011 |

OTHER PUBLICATIONS

Minsong Huang et al., Application and design for imaging and measurement system based on photodiode array, Chinese Journal of Quantum Electronics, 2015, pp. 621-626, vol. 32 No.5.

Tian-Hong Mu et al., A Design And Implementation Of Velocity Measuring System Based On Light Screen, Journal of Jinggangshan University (Natural Science), 2013, pp. 51-55, vol. 34 No.6.

Zhe-Hai Zhou, Design and realization of the optical system in a precipitation particle spectrometer, Laser & Infrared, 2016, pp. 487-491, vol. 46 No.4.

* cited by examiner

DUAL LINE DIODE ARRAY DEVICE AND MEASUREMENT METHOD AND MEASUREMENT DEVICE FOR PARTICLE VELOCITY

CROSS-REFERENCE TO THE RELATED APPLICATIONS

This application is the national stage entry of International Application No. PCT/CN2018/076211, filed on Feb. 11, 2018, which is based upon and claims priority to Chinese Patent Application No. 201810078235.0, filed on Jan. 26, 2018; Chinese Patent Application No. 201810078233.1, filed on Jan. 26, 2018; and Chinese Patent Application No. 201810077744.1, filed on Jan. 26, 2018, the entire contents of which are incorporated herein by reference.

TECHNICAL FIELD

The present invention relates to the field of particle measurement, in particular to a dual line photodiode array device and a measurement method and measurement device for particle velocity.

BACKGROUND

Particles of various sizes and shapes exist in the nature, such as cloud droplets, raindrops and ice crystals in the cloud, ocean water droplets on the ocean, dust particles in sandstorms, and volcanic ash from volcanic eruption. Accurate measurement of such physical parameters as size, shape and falling velocity of these particles is of great significance to the understanding of the development and changing processes of corresponding natural phenomena.

At present, one of the major methods of particle measurement is an optical measurement method, which can be specifically divided into a measurement technology based on optical scattering and a measurement technology based on optical imaging. Through the measurement technology based on optical scattering, the size of particles can be measured, but specific shape information of particles cannot be acquired, and the measured particle size range is limited. Through the measurement technology based on optical imaging, not only the size of particles can be measured, but also the image of particles can be recorded, and shape information of particles can be acquired according to the image of particles.

The particle measurement technology based on optical imaging mainly includes a particle imaging measurement device based on a single linear array and a particle imaging measurement device based on a CCD camera. The particle imaging measurement device based on a CCD camera can accurately image the size and shape of particles, but cannot measure the particle velocity; in addition, due to the limited framing rate of the CCD camera, the application of the CCD camera in high-density and high-velocity scenes is limited. A particle imaging measurement device based on a single linear array can measure the size, shape and velocity of particles, however, since the sampling rate of the particle image is predetermined and cannot be matched with the velocity of particles, the measured particle image will have a great deviation, thereby seriously influencing accuracy in measurement of physical parameters of particles. At present, two single linear arrays may also be utilized to measure the particle velocity, however, when two single linear arrays are utilized to measure the particle velocity, due to the limit of an element itself, the distance between two linear arrays is far, and the measurement is easily influenced by the external environment, for example, wind. In addition, separated components may have errors during installation, leading to limited accuracy and low precision in measurement of particle velocity.

At present, the main method of raindrop automatic measurement is to measure particles with laser, and can be specifically divided into a measurement technology based on optical scattering and a measurement technology based on optical imaging. Through the measurement technology based on optical scattering, the size of raindrops can be measured, but specific shape information of rainfall particles cannot be acquired, and the measured particle size range is limited. Through the measurement technology based on optical imaging, not only the size of rainfall particles can be measured, but also the image of rainfall particles can be recorded, and the shape information of rainfall particles can be acquired according to image of rainfall particles.

The raindrop measurement technology based on optical imaging mainly includes a precipitation particle imaging measurement device based on a single linear array and a precipitation particle imaging measurement device based on a CCD camera. The particle imaging measurement device based on a CCD camera can accurately image the size and shape of particles, but cannot measure the particle velocity; in addition, due to a limited framing rate of the CCD camera, the application of the CCD camera in high-density and high-velocity scenes is limited. The particle imaging measurement device based on a single linear array can measure the size, shape and velocity of particles, however, since the sampling rate of the particle image is determined and cannot be matched with the falling velocity of particles, the measured particle image will have a great deviation, thereby seriously influencing in the accuracy in the particles' physical parameter measurement. At present, two single linear arrays may also be utilized to measure the falling velocity of rainfall particles, however, when two single linear arrays are utilized to measure the falling velocity of particles, since two linear arrays are separated, such that due to the limit of an element itself, the installation distance between two linear arrays is far, the distance between two linear arrays has a certain error, and the measurement is easily influenced by the external environment, for example, wind, thereby leading to limited accuracy and low precision in measurement of falling velocity of particles.

In early observation methods of sea spray, the ocean water droplets generated by breaking waves were observed with reagent paper, however, this required a lot of manual work, the efficiency was low, and only large ocean water droplets could be measured. In recent years, optical-based sea spray measurement has been widely used. The optical-based sea spray measurement can be specifically divided into a measurement technology based on optical scattering and a measurement technology based on optical imaging. Through a measurement technology based on optical scattering, the size of particles can be measured, but specific shape and velocity information of particles cannot be acquired, and the measured particle size range is limited. Through the measurement technology based on optical imaging, not only the size of particles can be measured, but also the image of particles can be recorded, and shape information of particles can be acquired according to image of particles, but velocity information of sea spray cannot be acquired through the existing optical imaging technology.

SUMMARY

A first objective of the present invention is to overcome shortcoming of low precision of particle velocity measurement in the existing optical imaging measurement technology, and design a dual line photodiode array device. The device not only can image particles, but also can effectively measure the velocity of particles.

A second objective of the present invention is to overcome shortcoming of low precision of measurement of falling velocity of raindrops in the existing optical imaging measurement technology, and design a raindrop measurement device based on a twin-line array. The device not only can image raindrops, but also can integrate two groups of photodiode arrays on one sensor, and the falling velocity of raindrops can be measured accurately and effectively.

A third objective of the present invention is to overcome the shortcoming of measurement of sea spray in the existing measurement technology based on optical imaging, and design a sea spray measurement device based on a twin-line array. The device can not only perform imaging and particle size measurement on the sea spray, but also effectively measure the velocity of sea spray by adopting two groups of photodiode arrays.

To achieve the above objectives, the present invention provides a dual line photodiode array device, the dual line photodiode array device is to encapsulate, on a photoelectric sensing element, two columns of photodiode array units having the same specification and performance; and the dual line photodiode array includes a first photodiode array unit and a second photodiode array unit which are arranged in parallel and is used for achieving the measurement of particle size and particle velocity.

As an improvement of the above device, the photodiode array unit is composed of N photodiodes; wherein 32≤N≤512.

As an improvement of the above device, a light-receiving surface of the photodiode is square, and the size of side length ranges from 25 μm to 200 μm.

As an improvement of the above device, the distance s between the first photodiode array unit and the second photodiode array unit ranges from 1 mm to 10 mm.

Based on the above dual line photodiode array device, the present invention further provides a measurement method for particle velocity, and the method includes: when a particle passes through the dual line photodiode array device, acquiring the time difference between the time at which the particle passes through the first photodiode array unit and the time at which the particle passes through the second photodiode array unit, and calculating the velocity of particle according to the distance s between the first photodiode array unit and the second photodiode array unit.

As an improvement of the above method, the method specifically includes:

when a particle passes through a laser beam output by a light source, and when the particle firstly passes through the first photodiode array unit, the unit will output a pulse indicating signal to an FPGA chip, at this time, the FPGA chip will record the time t1 at which the pulse is received; when the particle continues to fly and reaches the second photodiode array unit, the unit outputs a pulse indicating signal to the FPGA chip, and the FPGA chip will record the time as time t2; and the velocity v of particle can be acquired after calculation:

$$v = \frac{s}{t2-t1}$$

To realize the above objective, the present invention provides a raindrop measurement device based on a twin-line array, and the device includes: an optical system, a dual line photodiode array, a photoelectric signal acquisition and processing circuit, and a data processing module;

the optical system is configured to output a collimated laser beam with uniform light intensity distribution which directly irradiates onto the dual line photodiode array, and is configured to image raindrops captured by the dual line photodiode array;

the dual line photodiode array is to encapsulate, on a photoelectric sensing element, two columns of photodiode array units having the same specification and performance; when raindrops pass by, the dual line photodiode array outputs timing pulse signals passing through two photodiode array units to a photoelectric signal acquisition and processing circuit for processing;

the photoelectric signal acquisition and processing circuit is configured to process the received timing pulse signals output by the dual line photodiode array, calculate the falling velocity of raindrops, update the sampling rate of raindrop images in real time according to falling velocity of raindrops to collect and process images of raindrops formed on the photodiode array and acquire the diameter and actual image of raindrops, and then upload the processed data to the data processing module;

the data processing module is configured to calculate one or more parameters of precipitation, rainfall intensity and polarization degree of radar reflectivity according to the measured raindrop diameter and raindrop velocity.

As an improvement of the above device, the optical imaging system includes: a light source, a laser beam shaping module and an imaging optical module;

the light source is a semiconductor laser which outputs a circular laser beam with uniform light intensity distribution;

the laser beam shaping module is a lens and is configured to collimate the laser beam output by the light source into a parallel laser beam; and the imaging optical module is configured to realize imaging of particles at different resolutions through configuring lenses of different parameters.

As an improvement of the above device, the raindrop measurement device further includes a heating module configured to heat a light outlet of the light source; the raindrop measurement device further includes a plurality of rain-proof components; the top of each rain-proof component is in the shape of a pointed arc, and the plurality of rain-proof components are respectively arranged at the top of the laser beam shaping module, the imaging optical module and the photoelectric signal acquisition and processing circuit.

As an improvement of the above device, the imaging optical module adopts a form in which a convex lens is combined with a concave lens, and the ratio of image size to particle size is 1:1.

As an improvement of the above device, the imaging optical module adopts a form in which two convex lenses are combined, wherein a first convex lens realizes magnification in an equal proportion, and the second convex lens realizes 4 times magnification.

As an improvement of the above device, the dual line photodiode array includes a first photodiode array unit and a second photodiode array unit, the distance s between the first photodiode array unit and the second photodiode array unit is fixed, and s ranges from 1 mm to 10 mm; the photodiode array unit is composed of N photodiodes, wherein 32≤N≤512; and a light-receiving surface of the photodiode is square, and the size of side length ranges from 25 μm to 200 μm.

As an improvement of the above device, the photoelectric signal acquisition and processing circuit includes: a front-end signal conditioning circuit and an FPGA control circuit;

the front-end signal conditioning circuit is configured to perform quick response processing on weak transient signals generated by the dual line photodiode array, and provide a binary signal to the back-end FPGA control circuit; and the FPGA control circuit includes an FPGA chip, and is configured to calculate the velocity of raindrops when raindrops firstly appear in the dual line photodiode array, update the sampling rate according to velocity, collect the raindrop images, acquire the diameter of the raindrops, compress the collected raindrop image data and the parameter information for storage, collect three-channel monitoring voltage values after the collected raindrop image data and parameter information are stored for one frame, and upload the three-channel monitoring voltage values and compressed image data to a data processing module through a network.

As an improvement of the above device, the front-end signal conditioning circuit includes: a transresistance amplification circuit U1, a post-stage signal amplification circuit U2, a voltage-dividing emitter follower circuit U3 and a comparison circuit U4;

the transresistance amplification circuit U1 is configured to convert current signals output by the dual line photodiode array into voltage signals;

the post-stage signal amplification circuit U2 is configured to amplify voltage signals output by the transresistance amplification circuit U1;

the voltage-dividing emitter follower circuit U3 is configured to provide a threshold reference level for comparison for the comparison circuit U4; and the comparison circuit U4 is configured to compare the input signals with the voltage threshold reference level, and the output voltage is only of two states: high level or low level, if 1 represents high level, and 0 represents low level, then the output of the comparison circuit U4 just corresponds to the state of whether raindrops are shielded.

The present invention further provides a raindrop measurement method implemented based on the above measurement device, and the method includes:

Step 1) when a raindrop passes through a laser beam output by the light source, and when the raindrop firstly passes through the first photodiode array unit, the unit will output a pulse indicating signal to an FPGA chip, at this time, the FPGA chip will record the time t1 at which the pulse is received; when the raindrop continues to fall and reaches the second photodiode array unit, the unit will also output a pulse indicating signal to the FPGA chip, and the FPGA chip will record the time as time t2; and the falling velocity of raindrop can be acquired after calculation:

$$v = \frac{s}{t2 - t1}$$

Step 2) the device calculates the sampling frequency of raindrop images according to the velocity, updates the sampling rate of the FPGA chip, collects the raindrop images, acquires diameter information of raindrops, and compresses the collected and processed raindrop image and parameter information by adopting a run length encoding compression algorithm;

Step 3) the compressed raindrop images and parameter data are packaged, and then the raindrop image data is sent to the data processing and display module through a network; and Step 4) the data processing module calculates the precipitation, the rainfall intensity, the precipitation visibility and radar reflectivity according to measured raindrop diameter and raindrop velocity.

As an improvement of the above method, the formula of calculating the sampling frequency f of the raindrop images according to the velocity in step 2) is as follows:

f=v/Res wherein Res is the resolution of an optical system.

In order to achieve the above objective, the present invention provides a sea spray measurement device based on a twin-line array, and the device includes: an optical system, a dual line photodiode array, a photoelectric signal acquisition and processing circuit, and a data processing and display module;

the optical system is configured to output a collimated laser beam with uniform light intensity distribution which directly irradiates onto the dual line photodiode array, and is configured to image sea spray captured by the dual line photodiode array;

the dual line photodiode array is to encapsulate, on a photoelectric sensing element, two columns of photodiode array units having the same specification and performance; when sea spray passes by, the dual line photodiode array outputs timing pulse signals passing through two photodiode array units to a photoelectric signal acquisition and processing circuit for processing; and the photoelectric signal acquisition and processing circuit is configured to process the received timing pulse signals output by the dual line photodiode array, calculate the velocity of sea spray, update the sampling rate of sea spray particle images in real time to collect and process images of sea spray formed on the photodiode array, and then upload the processed data to the data processing and display module.

As an improvement of the above device, the optical system includes: a light source, a laser beam shaping module and an imaging optical module;

the light source is a semiconductor laser which outputs a circular laser beam with uniform light intensity distribution;

the laser beam shaping module is a lens and is configured to collimate the laser beam output by the light source into a parallel laser beam; and the imaging optical module is configured to realize imaging of particles at different resolutions through configuring lenses of different parameters.

As an improvement of the above device, the imaging optical module adopts a form in which a convex lens is combined with a concave lens, and the ratio of image size to particle size is 1:1.

As an improvement of the above device, the imaging optical module adopts a form in which two convex lenses are combined, wherein a first convex lens realizes magnification in an equal proportion, and the second convex lens realizes 4 times magnification.

As an improvement of the above device, the dual line photodiode array includes a first photodiode array unit and a second photodiode array unit, the distance s between the first photodiode array unit and the second photodiode array unit is fixed, and s ranges from 1 mm to 10 mm; each photodiode array unit is composed of N photodiodes, wherein 32≤N≤512; and a light-receiving surface of the photodiode is square, and the size of side length ranges from 25 μm to 200 μm.

As an improvement of the above device, the photoelectric signal acquisition and processing circuit includes: a front-end signal conditioning circuit and an FPGA control circuit;

the front-end signal conditioning circuit is configured to perform quick response processing on weak transient signals generated by the dual line photodiode array, and provide a binary signal to the back-end FPGA control circuit;

the FPGA control circuit includes an FPGA chip, and is configured to calculate the velocity of sea spray when sea spray firstly appears in the dual line photodiode array, update the sampling rate according to velocity, collect the particle images, compress the collected sea spray image data for storage, collect three-channel monitoring voltage values after the collected sea spray image data are stored for one frame, and upload the three-channel monitoring voltage values and compressed image data to a data processing and display module through a network.

As an improvement of the above device, the front-end signal conditioning circuit includes: a transresistance amplification circuit U1, a post-stage signal amplification circuit U2, a voltage-dividing emitter follower circuit U3 and a comparison circuit U4;

the transresistance amplification circuit U1 is configured to convert current signals output by the dual line photodiode array into voltage signals;

the post-stage signal amplification circuit U2 is configured to amplify voltage signals output by the transresistance amplification circuit U1;

the voltage-dividing emitter follower circuit U3 is configured to provide a threshold reference level for comparison for the comparison circuit U4; and the comparison circuit U4 is configured to compare the input signals with the voltage threshold reference level, and the output voltage is only of two states: high level or low level, if 1 represents high level, and 0 represents low level, then the output of the comparison circuit U4 just corresponds to the state of whether particles are shielded.

The present invention further provides a sea spray measurement method implemented based on the above measurement device, and the method includes:

Step 1) when sea spray passes through a laser beam output by the light source, and when sea spray firstly passes through the first photodiode array unit, the unit will output a pulse indicating signal to an FPGA chip, at this time, the FPGA chip will record the time t1 at which the pulse is received; when sea spray continues to fly and reaches the second photodiode array unit, the unit will also output a pulse indicating signal to the FPGA chip, and the FPGA chip will record the time as time t2; and the velocity of sea spray can be acquired after calculation:

$$v = \frac{s}{t2 - t1}$$

Step 2) the device calculates the sampling frequency of sea spray images according to the velocity, updates the sampling rate of the FPGA chip, collects the sea spray images, and performs a run length encoding compression algorithm on the collected signals to compress the sea spray image data;

Step 3) the compressed sea spray image data is packaged, and then the sea spray image data is sent to the data processing and display module through a network; and Step 4) the data processing and display module performs statistical processing, display and storage on the uploaded data.

As an improvement of the above method, the formula of calculating the sampling frequency f of the sea spray images according to the velocity in step 2) is as follows:

f=v/Res wherein Res is the resolution of an optical system.

The present invention has the following advantages:

1. In the present invention, two groups of photodiode arrays are integrated on a single photosensitive element, thereby greatly reducing the distance between two groups of photodiode arrays, and more accurately measuring the particle velocity;

2. In the measurement device of the present invention, two groups of photodiode arrays are integrated on a single photosensitive element, thereby greatly reducing the distance between two groups of photodiode arrays, and accurately measuring the falling velocity of the raindrops while performing imaging measurement on the size and shape of the raindrops;

3. In the measurement device of the present invention, the optimal adoption rate of the image collected by an FPGA chip can be calculated through calculating the velocity of raindrops and is updated, such that the image of raindrops is clearer;

4. In the measurement device of the present invention, two groups of photodiode arrays are integrated on a single photosensitive element, thereby greatly reducing the distance between two groups of photodiode arrays, and accurately measuring the flying velocity of the sea spray while performing imaging measurement on the size and shape of the sea spray; and 5. In the measurement device of the present invention, the optimal adoption rate of the image collected by an FPGA chip can be calculated through calculating the velocity of sea spray and is updated, such that the image of sea spray is more accurate and clearer.

DETAILED DESCRIPTION OF THE EMBODIMENTS

A brief description will be given below on the present invention in combination with accompanying drawings and specific embodiments.

Figure 1:
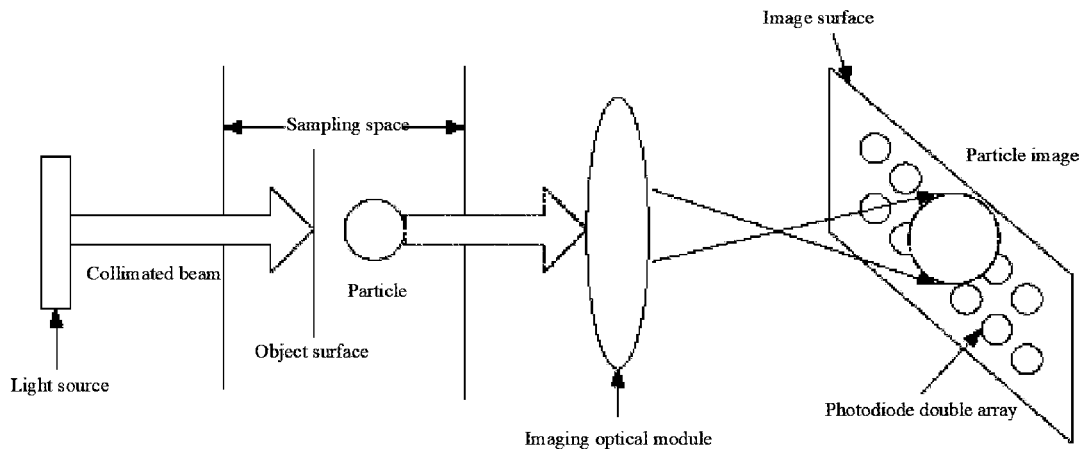
FIG. 1 is a schematic diagram of a measurement device of the present invention.
Figure 2:
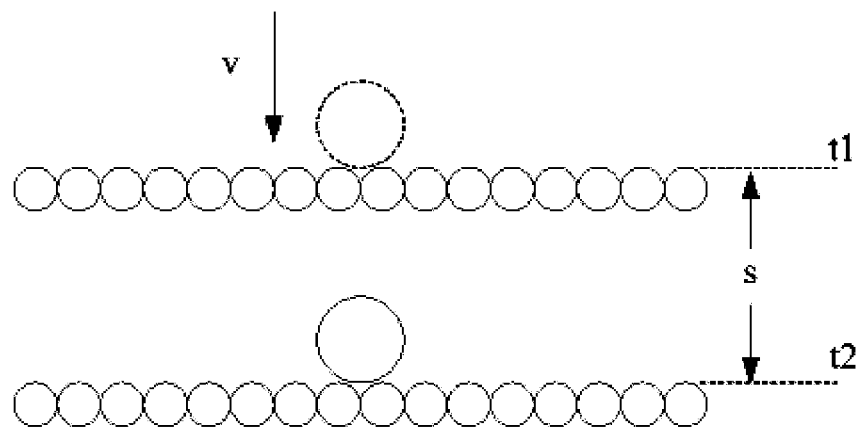
FIG. 2 is a schematic diagram of velocity measurement of the device of the present invention.

The measurement principle of the particle measurement device based on a twin-line array is as follows: a collimated laser with uniform light intensity distribution passes through an optical imaging system and directly irradiates onto a photosensitive element with two columns of photodiode arrays, and the two columns of photodiode arrays are distributed in parallel and fixed in distance. When a particle passes through the laser beam area, the particle will shield the laser beam and is imaged by an optical system onto a photosensitive element with two columns of photodiode arrays, the two columns of photodiode arrays are simultaneously scanned at a certain frequency, and after the scanned signals are processed with a subsequent circuit, a complete particle image can be acquired by selecting any of the array signals, as shown in FIG. 1. In addition, a time difference exists between the time at which the particle passes through the two photodiode arrays, while the distance between two photodiode arrays is fixed, as shown in FIG. 2, therefore, the velocity at which the particle passes through an instrument sampling area can be acquired through measuring the time difference.

The dual line photodiode array is to encapsulate, on a photoelectric sensing element, two columns of photodiode array units having the same specification and performance, and the dual line photodiode array includes a first photodiode array unit and a second photodiode array unit; the distance s between the two photodiode array units is fixed, and s ranges from 1 mm to 10 mm; the photodiode array unit is composed of N photodiodes, wherein $32 \leq N \leq 512$. A light-receiving surface of the photodiode is square, and the size of side length ranges from 25 µm to 200 µm; when the magnification of the imaging optical module is 1, the resolution Res of the instrument is just 100 µm, at this time, the measurement range of the instrument is 100 µm to 6400 µm; when the magnification of the imaging optical module is 4, the resolution Res of the instrument is 25 µm, and the particle size measured by the instrument ranges from 25 µm to 1600 µm. When a particle passes through the first photodiode array unit from top to bottom, the array will output a pulse signal to an FPGA chip due to reduced light intensity, and the FPGA chip will record the time as time t1; when the particle continues to fall and reaches the second photodiode array unit, the array will also output a pulse indicating signal to the FPGA chip, and the FPGA chip will record the time as time t2. The velocity v of the particle can be acquired after calculation:

$$f = v/Res$$

Figure 3:
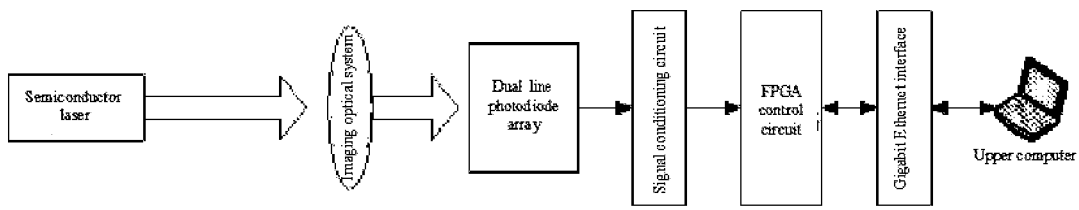
FIG. 3 is a schematic diagram of a measurement device of the present invention.

As shown in FIG. 3, a raindrop measurement device based on a twin-line array is shown, and the device includes an optical system, a dual line photodiode array, a photoelectric signal acquisition and processing circuit, and a data processing and display module.

Figure 4:
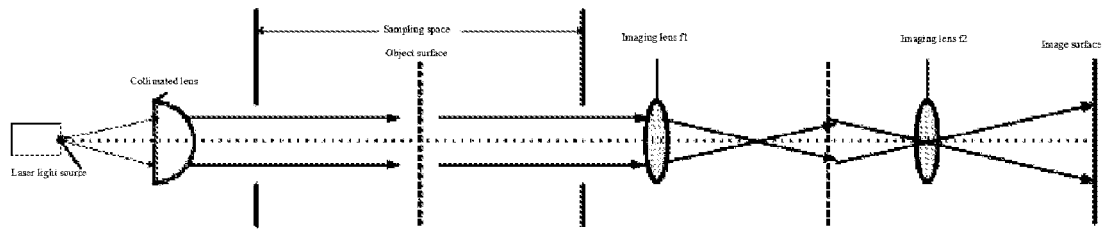
FIG. 4 is a schematic diagram of an optical system of the present invention.

As shown in FIG. 4, the optical system includes: a light source, a laser beam shaping module and an imaging optical module; the light source is a semiconductor laser with a wavelength of 660 nm, after optical shaping, the laser outputs a collimated circular laser beam with uniform light intensity distribution, and the light beam passes through the imaging optical module and directly irradiates onto the dual line photodiode array.

Wherein the light source is a semiconductor laser with a wavelength of 660 nm, and outputs a collimated circular laser beam with uniform light intensity distribution; the laser beam shaping module is a lens, and is configured to collimate the laser beam of the semiconductor laser into a parallel laser beam; the optical imaging module adopts the optical imaging principle of a Kepler telescope, and selects a convex lens with appropriate parameters on the optical path output from the laser to the receiving surface of the detector element, such that with the center of the sampling area, that is, the middle point of the two detection arms as an object surface, the objects thereon can all be clearly imaged on the plane which takes the receiving surface of the detector as an image surface, and the image is free of distortion. When the whole optical path is fixed, through configuring lenses of different parameters, imaging of objects at different resolutions can be realized. During practical applications, two sets of lenses with different parameters can be selected, thereby respectively realizing imaging of particles at equal proportions and imaging of particles with 4 times magnification. Such parameters as the size and shape of the raindrops can be acquired according to raindrop images.

Figure 5:
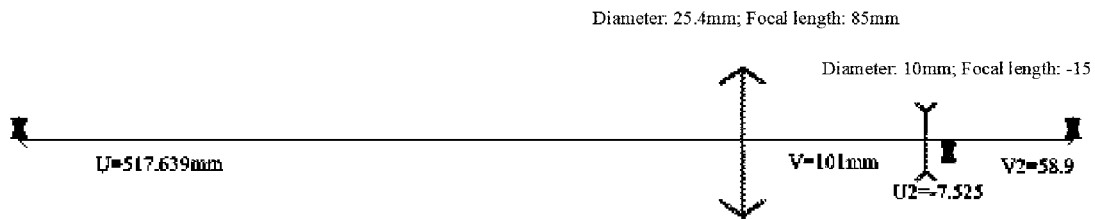
FIG. 5 is a schematic diagram of an optical lens group in an equal proportion of an imaging optical module of the present invention.

As shown in FIG. 5, the imaging optical module adopts a form in which a convex lens is combined with a concave lens, the convex lens is reduced, and the concave lens is magnified, and finally, the ratio of the image size to the particle size is 1:1.

Figure 6:
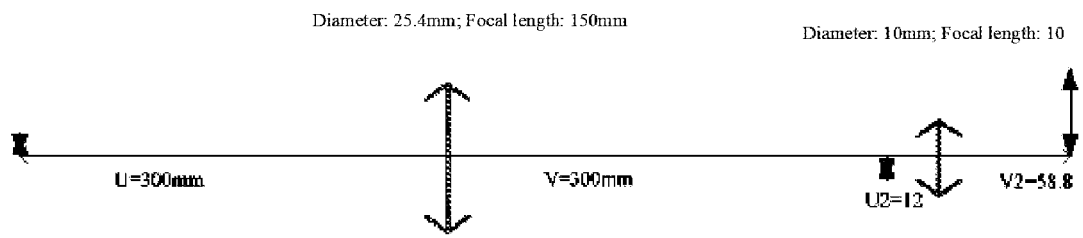
FIG. 6 is a schematic diagram of an optical lens group magnified by 4 times of the imaging optical module of the present invention.

As shown in FIG. 6, the imaging optical module adopts a form in which two convex lenses are combined, wherein a first convex lens realizes magnification in an equal proportion, and the second convex lens realizes 4 times magnification.

The photoelectric signal acquisition and processing circuit includes: a front-end signal conditioning circuit and an FPGA control circuit; the dual line photodiode array outputs a current signal in proportion to the laser intensity, the current signal passes through the front-end signal conditioning circuit and is converted into a binary signal which can be directly collected by the FPGA control circuit, the binary signal is processed by the FPGA control circuit and is compressed in a certain data format, and through a gigabit Ethernet interface, the compressed data will be uploaded to the data processing and display module for processing, displaying and storage. The data processing and display module runs on an upper computer.

The front-end signal conditioning circuit is mainly configured to perform quick response processing on weak transient signals generated by the photodiode array, and provide a binary signal to the back-end FPGA control circuit.

Figure 7:
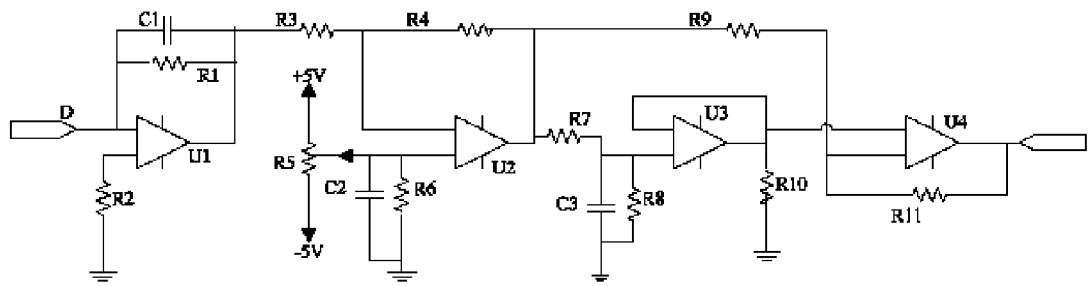
FIG. 7 is a schematic diagram of a front-end signal conditioning circuit of the present invention.

As shown in FIG. 7, the front-end signal conditioning circuit includes: a transresistance amplification circuit U1, a post-stage signal amplification circuit U2, a voltage-dividing emitter follower circuit U3 and a comparison circuit U4.

Wherein the transresistance amplification circuit U1 is configured to convert current signals output by the photodiode array into voltage signals; the post-stage signal amplification circuit U2 is configured to amplify voltage signals output by the transresistance amplification circuit U1 to satisfy subsequent processing requirements; the voltage-dividing emitter follower circuit U3 is configured to provide a threshold reference level for comparison for the comparison circuit U4; and the comparison circuit U4 is configured to compare the input signal voltage, and the output voltage is only in two possible states: high level or low level, if 1 represents high level, and 0 represents low level, then the output of the comparison circuit U4 just corresponds to the state of whether particles are shielded. In the present embodiment, when the laser irradiates directly, half of the voltage value generated by light intensity received by the dual line photodiode array is taken as the threshold voltage of the comparison circuit of a branching unit of the sensor, that is, the laser intensity received by the dual line photodiode array being reduced by more than a half represents the event of particle appearance.

Figure 8:
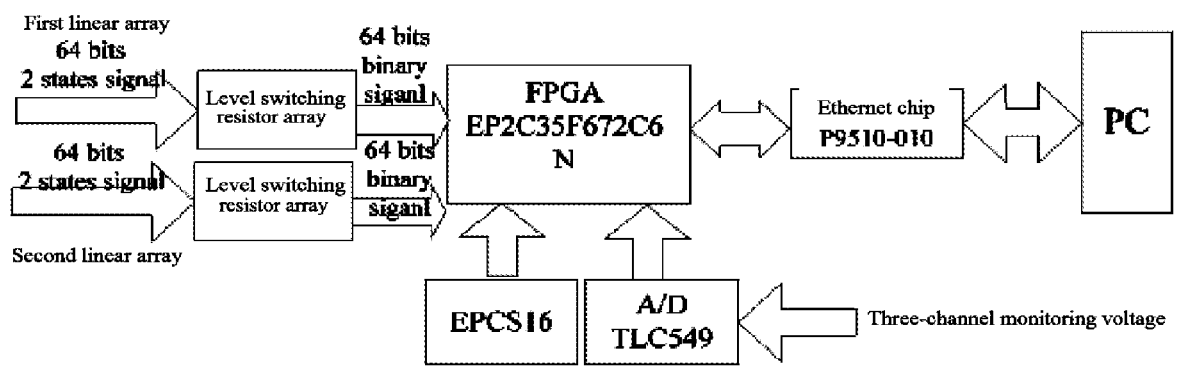
FIG. 8 is a schematic diagram of an FPGA control circuit of the present invention.

The FPGA control circuit adopts EP2C35F672C6N of an FPGA chip as a core unit of the whole circuit, and completes such high-speed computation of particle falling velocity and particle image data compressing and coding. The block diagram of the whole FPGA control circuit is as shown in FIG. 8. The configuration module PROM EPCS16 stores configuration information of the system, an ADC chip TLC549 is configured to read the working state of the instrument, and the 64 bits information of the two linear arrays are converted by an exclusion level and are input into the FPGA chip in sequence, and are collected by the FPGA chip. When particles appear, the device will compute the time at which particles first appear in the dual line photodiode array to obtain the falling velocity of particles, update the sampling rate to collect the particle images, compress the collected particle image data for storage, collect three-channel monitoring voltage values after the collected particle image data are stored for one frame, and upload the three-channel monitoring voltage values and image data to an upper computer in the manner of network transmission.

As important micro physical properties in a precipitation process, the measurement of size, shape and falling velocity of precipitation particles is of great significance to the understanding of the precipitation process and parameterization of the weather and climate model. Measurement of ground precipitation particles and the falling velocity based on a dual line photodiode array mainly utilizes a collimated laser beam with uniform light intensity distribution which directly irradiates onto a photodiode array of a sensor, and the light spot of the laser beam can completely cover the whole photodiode array after passing through an imaging optical module. Under the irradiation of the laser beam, each sensing unit will generate a current value which is directly proportional to the laser intensity received by each sensing unit. When particles pass through the laser beam area, the intensity of laser irradiating onto the sensing unit is changed due to shielding of the particles, such that the current value generated by the sensing unit is changed, leading to a changed light energy change value of each unit:

$$\Delta E = \frac{a}{A} \times E$$

In the formula: E is the light energy of a constant signal output by an array unit with no shielding from a particle, a is a projected area of particles, and A is an effective receiving area of an array unit. The shielding of light by particles is mainly caused by scattering and absorption of light, that is, extinction. The following formula can be obtained when an extinction coefficient is introduced:

$$\Delta E = E\left(1 - \frac{a}{A} K_e\right)$$

Wherein, $K_e$ is an extinction coefficient of particles. According to a Mie scattering theory, when the diameter of particles is larger than about 2 μm, the extinction coefficient $K_e$ generally takes its approximate value 2. Therefore, when $a=\frac{1}{2}A$, $\Delta E=0$, at this time, it can be deemed that the array unit is completely shielded. Therefore, in the presence of particles, more than 50% of attenuation of the light energy received by the photodiode unit is taken as the threshold value. When any unit satisfies the light energy attenuation threshold value, the current output by the unit is processed by a front-end signal conditioning circuit and will form a pulse signal which will be collected and sensed by an FPGA control circuit. After sensing that particles pass through the instrument sampling area, the FPGA chip will detect the current of each photodiode on the sensor array at a certain frequency f and process the detected signals.

Figure 9:
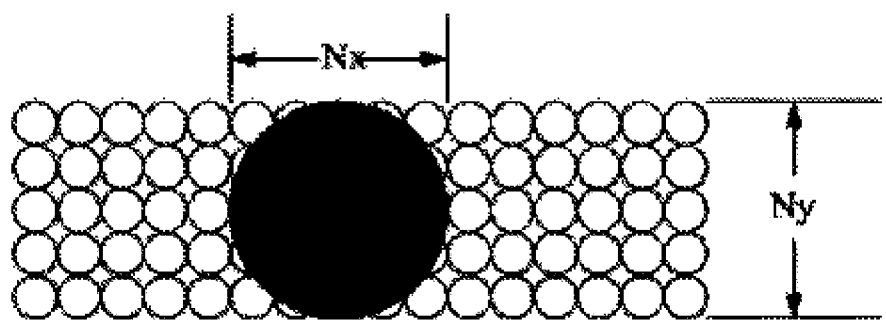
FIG. 9 is an image of rainfall particles reconstructed by the device of the present invention.

A group of signals acquired during each processing is called one slice, when multiple slice signals acquired from sampling are spliced together according to an acquisition sequence, the image of raindrops can be reconstructed and the size of raindrops can be measured. As shown in FIG. 9, Nx and Ny are respectively the largest number of units occupied by the raindrops on the two vertical axial directions, and the particle size of the raindrops in different directions can be acquired through multiplying the number of units by the resolution of the instrument. Such important parameter information as axial ratio of particles, rain intensity and radar reflectivity can also be acquired after particle size of particles is calculated. The sampling frequencyffor sampling array signals is determined according to the following formula:

f=b/Res

Wherein, Res is a resolution of the instrument. Therefore, precise measurement of the falling velocity of raindrops determines the accuracy of sampling frequency of the instrument, while whether the sampling frequency of the instrument is accurate further determines whether the measured image of precipitation particle is accurate, and further influences the accuracy in measuring physical parameters of precipitation particles by the instrument. Since the size and shape of precipitation particles are different, and the atmospheric environments during measurement are also different, the falling velocity of each precipitation particle is not the same, therefore, the falling velocity of each precipitation particle needs to be accurately measured to determine a proper sampling frequency.

To solve the problem of accurate measurement of falling velocity of raindrops, the present invention proposes that after the output pulse time of two columns of arrays is acquired, according to the formula $$v = \frac{s}{t2 - t1},$$

the FPGA chip will automatically calculate the falling velocity of raindrops. In combination with the resolution Res of the instrument, the particle image sampling rate f of the instrument can be calculated.

The measurement method for raindrop velocity includes the following steps:

Step 1) after the measurement device is energized, the measurement device enters an initialized state;

Step 2) when a raindrop passes through the device sampling area, the raindrop will pass through two columns of photodiode array units in sequence; when the raindrop firstly passes through a first photodiode array unit, the unit will output a pulse indicating signal to an FPGA chip, at this time, the FPGA chip will record the time t1 at which the pulse is received; when the raindrop continues to fall and reaches the first photodiode array unit, the unit will also output a pulse indicating signal to the FPGA chip, and the FPGA chip will record the time as time t2. The falling velocity of the raindrop can be acquired after calculation, and the sampling frequency of the raindrop image can be automatically adjusted according to the velocity;

Step 3) the device adjusts the image sampling frequency, collects and processes the raindrop image, and compresses the collected and processed signals by adopting a run length encoding compression algorithm;

Step 4) the compressed data will be packaged, and then the raindrop image data is sent to the data processing and display module through a network cable in a UDP network transmission manner; and Step 5) the data processing and display module will statistically process, display and store the uploaded data.

As shown in FIG. 3, a sea spray measurement device based on a twin-line array is shown. The device includes an optical system, a dual line photodiode array, a photoelectric signal acquisition and processing circuit, and a data processing and display module.

As shown in FIG. 4, the optical system includes: a light source, a laser beam shaping module and an imaging optical module; the light source is a semiconductor laser with a wavelength of 660 nm, after optical shaping, the laser outputs a collimated circular laser beam with uniform light intensity distribution, and the light beam passes through the imaging optical module and directly irradiates onto the dual line photodiode array.

Wherein the light source is a semiconductor laser with a wavelength of 660 nm, and outputs a collimated circular laser beam with uniform light intensity distribution; the laser beam shaping module is a lens, and is configured to collimate the laser beam of the semiconductor laser into a parallel laser beam; the optical imaging module adopts the optical imaging principle of a Kepler telescope, and selects a convex lens with appropriate parameters on the optical path output from the laser to the receiving surface of the detector element, such that with the center of the sampling area, that is, the middle point of the two detection arms as an object surface, the objects thereon can all be clearly imaged on the plane which takes the receiving surface of the detector as an image surface, and the image is free of distortion. When the whole optical path is fixed, through configuring lenses of different parameters, imaging of objects at different resolutions can be realized. During practical applications, two sets of lenses with different parameters can be selected, thereby respectively realizing imaging of particles at equal proportions and imaging of particles with 4 times magnification. Such parameters as the size and shape of the sea spray can be acquired according to sea spray images.

As shown in FIG. 5, the imaging optical module adopts a form in which a convex lens is combined with a concave lens, the convex lens is reduced, and the concave lens is magnified, and finally, the ratio of the image size to the particle size is 1:1.

As shown in FIG. 6, the imaging optical module adopts a solution in which two convex lenses are combined, wherein a first convex lens realizes magnification in an equal proportion, and the second convex lens realizes 4 times magnification.

The photoelectric signal acquisition and processing circuit includes: a front-end signal conditioning circuit and an FPGA control circuit; the dual line photodiode array outputs a current signal in proportion to the laser intensity, the current signal passes through the front-end signal conditioning circuit and is converted into a binary signal which can be directly collected by the FPGA control circuit, the binary signal is processed by the FPGA control circuit and is compressed in a certain data format, and through a gigabit Ethernet interface, the compressed data will be uploaded to the data processing and display module for processing, displaying and storage. The data processing and display module runs on an upper computer.

The front-end signal conditioning circuit is mainly configured to perform quick response processing on weak transient signals generated by the photodiode array, and provide a binary signal to the back-end FPGA control circuit.

As shown in FIG. 7, the front-end signal conditioning circuit includes: a transresistance amplification circuit U1, a post-stage signal amplification circuit U2, a voltage-dividing emitter follower circuit U3 and a comparison circuit U4.

Wherein the transresistance amplification circuit U1 is configured to convert current signals output by the photodiode into voltage signals; the post-stage signal amplification circuit U2 is configured to amplify voltage signals output by the transresistance amplification circuit U1 to satisfy subsequent processing requirements; the voltage-dividing emitter follower circuit U3 is configured to provide a threshold reference level for comparison for the comparison circuit U4; and the comparison circuit U4 is configured to compare the input signal voltage, and the output voltage is only in two possible states: high level or low level, if 1 represents high level, and 0 represents low level, then the output of the comparison circuit U4 just corresponds to the state of whether particles are shielded. In the present embodiment, when the laser irradiates directly, half of the voltage value generated by light intensity received by the dual line photodiode array is taken as the threshold voltage of the comparison circuit of a branching unit of the sensor, that is, the laser intensity received by the dual line photodiode array being reduced by more than a half represents the event of particle appearance.

The FPGA control circuit adopts EP2C35F672C6N of an FPGA chip as a core unit of the whole circuit, and completes such high-speed computation of sea spray velocity and sea spray image data compressing and coding. The block diagram of the whole FPGA control circuit is as shown in FIG. 8. The configuration module PROM EPCS16 stores configuration information of the system, an ADC chip TLC549 is configured to read the working state of the instrument, and the 64bits information of the two linear arrays are converted by an exclusion level and are input into the FPGA chip in sequence, and are collected by the FPGA chip. When particles appear, the device will compute the time at which particles first appear in the dual line photodiode array to obtain the falling velocity of particles, update the sampling rate to collect the particle images, compress the collected particle image data for storage, collect three-channel monitoring voltage values after the collected particle image data are stored for one frame, and upload the three-channel monitoring voltage values and image data to an upper computer in the manner of network transmission.

The sampling frequency f for sampling array signals is determined according to the following formula:

$$f = v/\text{Res}$$

Wherein, Res is a resolution of the instrument. Therefore, precise measurement of the velocity of sea spray determines the accuracy of sampling frequency of the instrument, while whether the sampling frequency of the instrument is accurate further determines whether the measured image of the sea spray is accurate, and further influences the accuracy in measuring physical parameters of sea spray by the instrument. Since the sizes of sea spray are different, and the atmospheric environments during measurement are also different, the velocity of each sea spray is not the same, therefore, the velocity of each sea spray needs to be accurately measured to determine a proper sampling frequency.

The measurement method for sea spray velocity includes the following steps:

Step 1) after the measurement device is energized, the measurement device enters an initialized state;

Step 2) when the sea spray passes through the device sampling area, the sea spray will pass through two columns of photodiode array units in sequence; when the sea spray firstly passes through a first photodiode array unit, the unit will output a pulse indicating signal to an FPGA chip, at this time, the FPGA chip will record the time t1 at which the pulse is received; when the sea spray continues to fly and reaches the first photodiode array unit, the unit will also output a pulse indicating signal to the FPGA chip, and the FPGA chip will record the time as time t2. The velocity of the sea spray can be acquired after calculation, and the sampling frequency of the sea spray image can be automatically adjusted according to the velocity;

Step 3) the device adjusts the image sampling frequency, collects the particle image, and performs a run length encoding compression algorithm on the collected signals to compress the particle image data;

Step 4) the compressed sea spray image data will be packaged, and then the sea spray image data is sent to the data processing and display module through a network cable in a UDP network transmission manner; and Step 5) the data processing and display module will statistically process, display and store the uploaded data.

Finally, it should be noted that, the above embodiments are merely used for illustrating, rather than for limiting, the technical solutions of the present invention. Although the present invention has been described in detail with reference to embodiments, those skilled in the art should understand that, all the modifications or equivalent substitutions made to the technical solutions of the present invention do not depart from the spirit and scope of the technical solution of the present invention, and shall all fall within the scope of claims of the present invention.

What is claimed is:

1. A raindrop measurement device based on a dual line photodiode array, wherein the raindrop measurement device comprises an optical system, a dual line photodiode array, a photoelectric signal acquisition and processing circuit, and a data processing module;

the optical system is configured to output a collimated laser beam with a uniform light intensity distribution, wherein the collimated laser beam directly irradiates onto the dual line photodiode array, and the raindrop measurement device is configured to image raindrops captured by the dual line photodiode array;

the dual line photodiode array comprises two columns of a plurality of photodiode array units having a same specification and performance; when the raindrops pass by, the dual line photodiode array outputs a plurality of timing pulse signals passing through two photodiode array units to the photoelectric signal acquisition and processing circuit for processing, wherein each photodiode array unit comprises a photoelectric sensing element;

the photoelectric signal acquisition and processing circuit is configured to process a plurality of received timing pulse signals output by the dual line photodiode array, calculate a falling velocity of the raindrops, update a sampling rate of a plurality of raindrop images in real time according to the falling velocity of the raindrops to collect and process a plurality of images of the raindrops formed on the dual line photodiode array and acquire a diameter and an actual image of the raindrops, and then upload processed data to the data processing module; and the data processing module is configured to calculate raindrop intensity according to measured raindrop diameter and raindrop velocity, wherein the dual line photodiode array comprises a first photodiode array unit and a second photodiode array unit, a distance s between the first photodiode array unit and the second photodiode array unit is fixed, and the distance s ranges from 1 mm to 10 mm; the photodiode array unit is composed of N photodiodes, wherein $32 \leq N \leq 512$; and a light-receiving surface of each of the first and second photodiode array units is square having a size of a side length ranging from 25 µm to 200 µm.

2. The raindrop measurement device based on the dual line photodiode array of claim 1, wherein the optical system comprises: a light source, a laser beam shaping module and an imaging optical module;

the light source is a semiconductor laser, wherein the semiconductor laser outputs a circular laser beam with the uniform light intensity distribution;

the laser beam shaping module is a lens and is configured to collimate the laser beam output by the light source into a parallel laser beam; and the imaging optical module is configured to realize imaging of a plurality of particles at a plurality of different resolutions through configuring a plurality of lenses of a plurality of different parameters.

3. The raindrop measurement device based on the dual line photodiode array of claim 2, wherein the raindrop measurement device further comprises a heating module configured to heat a light outlet of the light source; the raindrop measurement device further comprises a plurality of rain-proof components; a top of each rain-proof component of the plurality of rain-proof component is in a shape of a pointed arc, and the plurality of rain-proof components are respectively arranged at a top of the laser beam shaping module, the imaging optical module and the photoelectric signal acquisition and processing circuit.

4. The raindrop measurement device based on the dual line photodiode array of claim 2, wherein the imaging optical module adopts a form, wherein in the form a convex lens is combined with a concave lens, and a ratio of an image size to a particle size is 1:1.

5. The raindrop measurement device based on the dual line photodiode array of claim 2, wherein the imaging optical module adopts a form, wherein in the form two convex lenses are combined, and the second convex lens of the two convex lenses realizes 4 times magnification.

6. The raindrop measurement device based on the dual line photodiode array of claim 1, wherein the photoelectric signal acquisition and processing circuit comprises: a front-end signal conditioning circuit and an FPGA control circuit;

the front-end signal conditioning circuit is configured to perform a response processing on a plurality of transient signals generated by the dual line photodiode array, and provide a binary signal to a back-end FPGA control circuit; and the FPGA control circuit comprises an FPGA chip, and is configured to calculate the falling velocity of the raindrops when the raindrops firstly appear in the dual line photodiode array, update the sampling rate according to the falling velocity, collect the plurality of raindrop images, acquire a diameter of the raindrops, compress data of collected raindrop images and diameter of the raindrops for storage, collect a plurality of three-channel monitoring voltage values after the collected data of raindrop images and diameter of the raindrops are stored for one frame, and upload the plurality of three-channel monitoring voltage values and compressed image data to the data processing module through a network.

7. The raindrop measurement device based on the dual line photodiode array of claim 6, wherein the front-end signal conditioning circuit comprises: a transresistance amplification circuit U1, a post-stage signal amplification circuit U2, a voltage-dividing emitter follower circuit U3 and a comparison circuit U4;

the transresistance amplification circuit U1 is configured to convert a plurality of current signals output by the dual line photodiode array into a plurality of voltage signals;

the post-stage signal amplification circuit U2 is configured to amplify the plurality of voltage signals output by the transresistance amplification circuit U1;

the voltage-dividing emitter follower circuit U3 is configured to provide a voltage threshold reference level for comparison for the comparison circuit U4; and the comparison circuit U4 is configured to compare a plurality of input signals with the voltage threshold reference level, and an output voltage is only of two states: high level or low level, if 1 represents high level, and 0 represents low level, then an output of the comparison circuit U4 corresponds to a state of whether the raindrops are shielded.

8. A raindrop measurement method implemented based on the raindrop measurement device of claim 1, wherein the method comprises:

step 1) when a raindrop of the raindrops passes through a laser beam output by a light source, and when the raindrop of the raindrops firstly passes through a first photodiode array unit, the first photodiode array unit is configured to output a pulse indicating signal to an FPGA chip, at this time, the FPGA chip is configured to record a time t1, wherein at the time t1, a pulse is received; when the raindrop of the raindrops continues to fall and reaches the second photodiode array unit, the second photodiode array unit is also configured to output a pulse indicating signal to the FPGA chip, and the FPGA chip is configured to record the time as time t2; and the falling velocity of the raindrop of the raindrops is acquired after calculation:

$$v = \frac{s}{t2-t1}$$

step 2) the raindrop measurement device calculates a sampling frequency of plurality of raindrop images according to the falling velocity, updates the sampling rate of the FPGA chip, collects the plurality of raindrop images, acquires diameter information of the raindrops, and compresses collected and processed raindrop image and diameter information by adopting a run length encoding compression algorithm;

step 3) a plurality of compressed raindrop images and diameter information are packaged, and then raindrop image data is sent to a data processing and display module through a network; and step 4) the data processing module calculates raindrop intensity and visibility according to the measured raindrop diameter and the raindrop velocity.

9. The raindrop measurement method of claim 8, wherein a formula of calculating the sampling frequency f of the plurality of raindrop images according to the falling velocity in step 2) is as follows:

$$f=v/\text{Res}$$

wherein Res is a resolution of the optical system.

10. A sea spray measurement device based on a dual line photodiode array, wherein the sea spray measurement device comprises an optical system, a dual line photodiode array, a photoelectric signal acquisition and processing circuit, and a data processing and display module;

the optical system is configured to output a collimated laser beam with a uniform light intensity distribution, wherein the collimated laser beam directly irradiates onto the dual line photodiode array, and is configured to image a sea spray captured by the dual line photodiode array;

the dual line photodiode array comprises two columns of a plurality of photodiode array units having a same specification and performance;

when the sea spray passes by, the dual line photodiode array outputs a plurality of timing pulse signals passing through two photodiode array units to a photoelectric signal acquisition and processing circuit for processing, wherein each photodiode array unit comprises a photoelectric sensing element; and the photoelectric signal acquisition and processing circuit is configured to process a plurality of received timing pulse signals output by the dual line photodiode array, calculate a velocity of the sea spray, update a sampling rate of a plurality of sea spray particle images in real time to collect and process a plurality of images of the sea spray formed on the dual line photodiode array, and then upload processed data to the data processing and display module, wherein the dual line photodiode array comprises a first photodiode array unit and a second photodiode array unit, a distance s between the first photodiode array unit and the second photodiode array unit is fixed, and the distance s ranges from 1 mm to 10 mm; each photodiode array unit of the first and second photodiode array units is composed of N photodiodes, wherein $32 \leq N \leq 512$; and a light-receiving surface of a photodiode of the N photodiodes is square having a side length ranging from 25 μm to 200 μm.

11. The sea spray measurement device based on the dual line photodiode array of claim 10, wherein the optical system comprises: a light source, a laser beam shaping module and an imaging optical module;

the light source is a semiconductor laser, wherein the semiconductor laser outputs a circular laser beam with the uniform light intensity distribution;

the laser beam shaping module is a lens and is configured to collimate the laser beam output by the light source into a parallel laser beam; and the imaging optical module is configured to realize imaging of a plurality of particles at a plurality of different resolutions through configuring a plurality of lenses of a plurality of different parameters.

12. The sea spray measurement device based on the dual line photodiode array of claim 11, wherein the imaging optical module adopts a form, wherein in the form a convex lens is combined with a concave lens, and a ratio of an image size to a particle size is 1:1.

13. The sea spray measurement device based on the dual line photodiode array of claim 11, wherein the imaging optical module adopts a form, wherein in the form two convex lenses are combined, and the second convex lens of the two convex lenses realizes 4 times magnification.

14. The sea spray measurement device based on the dual line array of claim 10, wherein the photoelectric signal acquisition and processing circuit comprises: a front-end signal conditioning circuit and an FPGA control circuit;

the front-end signal conditioning circuit is configured to perform a response processing on a plurality of transient signals generated by the dual line photodiode array, and provide a binary signal to a back-end FPGA control circuit; and the FPGA control circuit comprises an FPGA chip, and is configured to calculate the velocity of sea spray when sea spray firstly appears in the dual line photodiode array, update the sampling rate according to the velocity, collect a plurality of particle images, compress collected sea spray image data for storage, collect a plurality of three-channel monitoring voltage values after the collected sea spray image data are stored for one frame, and upload the plurality of three-channel monitoring voltage values and compressed sea spray image data to the data processing and display module through a network.

15. The sea spray measurement device based on the dual line photodiode array of claim 14, wherein the front-end signal conditioning circuit comprises: a transresistance amplification circuit U1, a post-stage signal amplification circuit U2, a voltage-dividing emitter follower circuit U3 and a comparison circuit U4;

the transresistance amplification circuit U1 is configured to convert a plurality of current signals output by the dual line photodiode array into a plurality of voltage signals;

the post-stage signal amplification circuit U2 is configured to amplify the plurality of voltage signals output by the transresistance amplification circuit U1;

the voltage-dividing emitter follower circuit U3 is configured to provide a voltage threshold reference level for comparison for the comparison circuit U4; and the comparison circuit U4 is configured to compare a plurality of input signals with the voltage threshold reference level, and the output voltage is only of two states: high level or low level, if 1 represents high level, and 0 represents low level, then an output of the comparison circuit U4 corresponds to a state of whether a plurality of particles are shielded.

16. A sea spray measurement method implemented based on the sea spray measurement device of claim 10, wherein the method comprises:

step 1) when the sea spray passes through a laser beam output by a light source, and when the sea spray firstly passes through the first photodiode array unit, the first photodiode array unit is configured to output a pulse indicating signal to the FPGA chip, at this time, the FPGA chip is configured to record a time t1, wherein at the time t1 a pulse is received; when the sea spray continues to fly and reaches the second photodiode array unit, the second photodiode array unit is also configured to output a pulse indicating signal to the FPGA chip, and the FPGA chip is configured to record the time as time t2; and the velocity of the sea spray is acquired after calculation:

$$v = \frac{s}{t2-t1}$$

step 2) the sea spray measurement device calculates a sampling frequency of a plurality of sea spray images according to the velocity, updates the sampling rate of the FPGA chip, collects the plurality of sea spray images, and performs a run length encoding compression algorithm on a plurality of collected signals to compress sea spray image data;

step 3) compressed sea spray image data is packaged, and then the sea spray image data is sent to the data processing and display module through a network; and step 4) the data processing and display module is configured to statistically process, display and store uploaded data.

17. The sea spray measurement method of claim 16, wherein a formula of calculating the sampling frequency of the sea spray images according to the velocity in step 2) is as follows:

f=v/Res wherein Res is a resolution of the optical system.

* * * * *